United States Patent
Wang et al.

(10) Patent No.: US 9,691,986 B2
(45) Date of Patent: Jun. 27, 2017

(54) FURAN AND SELENOPHENE DERIVATIZED BENZO [1,2-B:4,5-B'] DITHIOPHENE-THIENOTHIOPHENE BASED CONJUGATED POLYMERS FOR HIGH-EFFICIENCY ORGANIC SOLAR CELLS

(71) Applicants: Phillips 66 Company, Houston, TX (US); Solarmer Energy, Inc., El Monte, CA (US)

(72) Inventors: Wei Wang, El Monte, CA (US); Chenjun Shi, El Monte, CA (US); Ruby Chen, El Monte, CA (US); Jun Yang, El Monte, CA (US); Yue Wu, El Monte, CA (US); Hui Huang, Bartlesville, OK (US); Kathy Woody, Bartlesville, OK (US); Joe Bullock, Bartlesville, OK (US); Amit Palkar, Bartlesville, OK (US); Ting He, Bartlesville, OK (US)

(73) Assignees: Solarmer Energy, Inc., El Monte, CA (US); Phillips 66 Company, Bartlesville, OK (US)

( * ) Notice: Subject to any disclaimer, the term of this patent is extended or adjusted under 35 U.S.C. 154(b) by 0 days.

(21) Appl. No.: 14/084,358

(22) Filed: Nov. 19, 2013

(65) Prior Publication Data
US 2014/0151657 A1    Jun. 5, 2014

Related U.S. Application Data

(60) Provisional application No. 61/732,774, filed on Dec. 3, 2012.

(51) Int. Cl.
C08G 75/00 (2006.01)
H01L 51/00 (2006.01)
H01L 51/42 (2006.01)

(52) U.S. Cl.
CPC ...... H01L 51/0043 (2013.01); H01L 51/0036 (2013.01); H01L 51/0047 (2013.01); H01L 51/4253 (2013.01); Y02E 10/549 (2013.01)

(58) Field of Classification Search
CPC ............ H01L 51/0036; H01L 51/4213; C08G 2261/124; C08G 2261/91; C08G 2261/414; Y02E 10/549
(Continued)

(56) References Cited

U.S. PATENT DOCUMENTS

| | | | |
|---|---|---|---|
| 7,928,237 B2 | 4/2011 | Clark et al. | |
| 2004/0119401 A1* | 6/2004 | Lee et al. | 313/504 |

(Continued)

FOREIGN PATENT DOCUMENTS

| | | |
|---|---|---|
| EP | 1279690 A1 | 1/2003 |
| WO | WO-2003032072 A2 | 4/2003 |

(Continued)

OTHER PUBLICATIONS

US 8,022,391, 09/2011, Sargent et al. (withdrawn)
(Continued)

*Primary Examiner* — Shane Fang
(74) *Attorney, Agent, or Firm* — Adams and Rees LLP

(57) ABSTRACT

Compositions, synthesis and applications for furan, thiophene and selenophene derivatized benzo[1,2-b:3,4-b']dithiophene(BDT)-thienothiophene (BDT-TT) based polymers, namely, poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl (CS-15), poly[(4,8-bis(5-(2-ethyhexyl)selenophen-2-yl)-benzo [1,2-b;4,5-b']dithiophene)-2,6-diyl-alt-(4-(2-ethylhexyl)-3-fluorothieno[3,4-b]thiophene)-2-carboxylate-2-6-diyl (CS-16), poly[(4,8-bis(5-(2-ethyhexyl)furan-2-yl)-benzo[1,2-b; 4,5-b']dithiophene)-2,6-diyl-alt-(4-(2-ethylhexyl)-3-
(Continued)

fluorothieno[3,4-b]thiophene)-2-carboxylate-2-6-diyl (CS-18) and poly[(4,8-bis(5-hexylfuran-2-yl)-benzo[1,2-b;4,5-b']dithiophene)-2,6-diyl-alt-(4-(2-ethylhexanoyl)-3-fluoro-thieno[3,4-b]thiophene)-2-6-diyl (CS-24) are disclosed. Further, an organic solar cell constructed of a derivatized benzo[1,2-b:3,4-b']dithiophene(BDT)-thienothiophene (BDT-TT) based polymer is discussed.

11 Claims, 8 Drawing Sheets

(58) Field of Classification Search
USPC .................................................. 528/377, 380
See application file for complete search history.

(56) References Cited

U.S. PATENT DOCUMENTS

| | | |
|---|---|---|
| 2005/0176684 A1 | 8/2005 | Bookser et al. |
| 2006/0071200 A1 | 4/2006 | Nordquist et al. |
| 2006/0223977 A1 | 10/2006 | Zahn et al. |
| 2009/0159120 A1 | 6/2009 | Wang et al. |
| 2009/0159131 A1 | 6/2009 | Zheng et al. |
| 2009/0159999 A1 | 6/2009 | Zheng et al. |
| 2010/0006148 A1 | 1/2010 | Zheng et al. |
| 2010/0018581 A1 | 1/2010 | Shrotriya et al. |
| 2010/0078074 A1 | 4/2010 | Yang et al. |
| 2010/0101636 A1 | 4/2010 | Zheng et al. |
| 2010/0224832 A1 | 9/2010 | Jou et al. |
| 2010/0276071 A1 | 11/2010 | Shrotriya et al. |
| 2010/0300520 A1 | 12/2010 | Su et al. |
| 2010/0326497 A1 | 12/2010 | Yang et al. |
| 2011/0008926 A1 | 1/2011 | Irvin et al. |
| 2011/0017956 A1* | 1/2011 | Hou et al. ............ 252/511 |
| 2011/0031875 A1 | 2/2011 | Jou et al. |
| 2011/0086994 A1 | 4/2011 | Wigglesworth et al. |
| 2011/0124822 A1 | 5/2011 | Yu et al. |
| 2011/0147725 A1 | 6/2011 | Seshadri |
| 2012/0071617 A1 | 3/2012 | Dueggeli et al. |
| 2012/0118368 A1 | 5/2012 | Huang et al. |
| 2012/0232237 A1 | 9/2012 | Li et al. |
| 2012/0264906 A1 | 10/2012 | Marks et al. |
| 2015/0041726 A1* | 2/2015 | He et al. ............ 252/500 |

FOREIGN PATENT DOCUMENTS

| | | |
|---|---|---|
| WO | WO-2010008672 A1 | 1/2010 |
| WO | WO-2011011545 A1 | 1/2011 |
| WO | WO-20110111545 A1 | 9/2011 |
| WO | WO-2012074853 A1 | 6/2012 |
| WO | WO-2012142460 A1 | 10/2012 |
| WO | WO-2012142469 A1 | 10/2012 |

OTHER PUBLICATIONS

Kleinhenz et al., *Low-band-gap polymers that utilize quinoid resonance structure stabilization by thienothiophene: Fine-tuing of HOMO level*, Macromolecules 44(4) (2011) 872-877.

PCT May 7, 2014 International Search Report and Written Opinion issued in International Patent Application PCT/US13/70674.

Liang, et al., *Development of new semiconducting polymers for high performance solar cells*, J. Am. Chem. Soc. 131(1) (2009) 56-57.

Liang, et al., *Highly efficient solar cell polymers developed via fine-tuning of structural and electronic properties*, J. Am. Chem. Soc. 131(22) (2009) 7792-799.

Chen, et al., *Polymer solar cells with enhanced open-circuit voltage and efficiency*, Nature Photonics 3 (2009) 649-53.

Huo, et al., *Replacing alkoxy groups with alkylthienyl groups: A feasible approach to improve the properties of photovoltaic polymers*, Angew. Chem. Int. Ed. 50(41) (2011) 9697-702.

Liang, et al., *For the bright future—Bulk heterojunction polymer solar cells with power conversion efficiency of 7.4%*, Adv. Mater. 22 (2010) E135-E138.

PCT Apr. 30, 2013 International Search Report and Written Opinion issued in International Application PCT/US2013/026092.

Dec. 12, 2014 Notice of Allowance/Allowability with Examiner's Amendment mailed in U.S. Appl. No. 13/764,919, filed Feb. 12, 2013.

Warnan, et al., *Ring substituents mediate the morphology of PBDTTPD-PCBM bulk-heterojunction solar cells*, Chem. Mater. 26 (2014) 2299-2306.

* cited by examiner

CS-15

| Acceptor | Chemical Structure |
|---|---|
| PC$_{70}$BM |  |
| BisIndene-C$_{70}$ |  |
| BisPC$_{70}$BM |  |
| BisBenzyne-C$_{70}$ |  |
| TrisPC$_{70}$BM |  |
| PC$_{76}$BM |  |

FURAN AND SELENOPHENE DERIVATIZED BENZO [1,2-B:4,5-B'] DITHIOPHENE-THIENOTHIOPHENE BASED CONJUGATED POLYMERS FOR HIGH-EFFICIENCY ORGANIC SOLAR CELLS

CROSS REFERENCE TO RELATED APPLICATIONS

The present application claims priority to U.S. Provisional Patent Application Ser. No. 61/732,774, filed on Dec. 3, 2012 for "Furan and Selenophene Derived Benzo[1,2-b:4,5-b']Dithiophene-Theienophene Based Conjugated Polymers for High-Efficiency Organic Solar Cells."

TECHNICAL FIELD

This invention relates generally to benzo[1,2-b:3,4-b']dithiophene(BDT)-thienothiophene (BDT-TT) based conjugated polymer compositions for organic solar cell applications. The invention relates to the composition, synthesis and application of furan, thiophene or selenophene derivatized BDT-TT based conjugated polymers for high-efficiency organic solar cell applications.

BACKGROUND OF THE INVENTION

Organic solar cells are being developed for clean renewable energy due to their potential for making cost-effective, large area devices. The performance of solar cells depend on the light-absorbing semiconducting materials. Alternating conjugated polymers based on a backbone structure of benzo[1,2-b:3,4-b']dithiophene-thienothiophene have demonstrated promising performance in organic solar cell applications. Benzo[1,2-b:3,4-b]dithiophene is one of the key monomers. The symmetric, planer structure of BDT provides excellent charge carrier mobility and optical absorption properties to the polymer.

The BDT conjugated polymer based solar cell is relatively inefficient due to inadequate optical absorption, relatively low charge carrier mobility and non-optimized device morphology. Thus, a BDT-TT based conjugated polymer is needed with an expanded conjugation system to cover a broader solar spectrum and with a tuned polymer packing to optimize the device morphology and enhance charge carrier mobility.

SUMMARY OF THE INVENTION

This invention relates generally to benzo[1,2-b:3,4-b']dithiophene-thienothiophene based conjugated polymer compositions for organic solar cell applications. The invention relates to compositions, synthesis and applications of furan, thiophene or selenophene derivatized BDT-TT based conjugated polymers for high-efficiency organic solar cell applications.

To improve the photovoltaic properties of the BDT series polymers, derivative aromatic units such as furan, thiophene and selenophene were introduced on BDT segments to expand the optical absorption range to cover a broader spectrum and to tune polymer packing to optimize the device morphology and to enhance charge carrier mobility. Considering that the derivative solubility adopts a sequence of furan>thiophene>selenophene, while their polarizability and ease of charge dissociation reverses this order, a balance of desired derivatized BDT properties may be achieved by finely tuning these derivatives. In the laboratory, the furan and selenophene derivatized BDT-TT based conjugated polymers compositions achieved power conversion efficiencies (PCE) in the range of about 3~8% in bulk heterojunction (BHJ) solar cells.

These and other objects, features, and advantages will become apparent as reference is made to the following detailed description, preferred embodiments, and examples, given for the purpose of disclosure, and taken in conjunction with the accompanying drawings and appended claims.

BRIEF DESCRIPTION OF THE DRAWINGS

For a further understanding of the nature and objects of the present inventions, reference should be made to the following detailed disclosure, taken in conjunction with the accompanying drawings, in which like parts are given like reference numerals, and wherein.

DETAILED DESCRIPTION OF PREFERRED EMBODIMENTS OF THE INVENTION

The following detailed description of various embodiments of the present invention references the accompanying drawings, which illustrate specific embodiments in which the invention can be practiced. While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled in the art to which the invention pertains. Therefore, the scope of the present invention is defined only by the appended claims, along with the full scope of equivalents to which such claims are entitled.

This invention discloses compositions, synthesis and applications of furan, thiophene and selenophene derivatized benzo[1,2-b:3,4-b']dithiophene-thienothiophene based conjugated polymers for high efficiency organic solar cell applications. See FIGS. 1 and 2.

Figure 1:
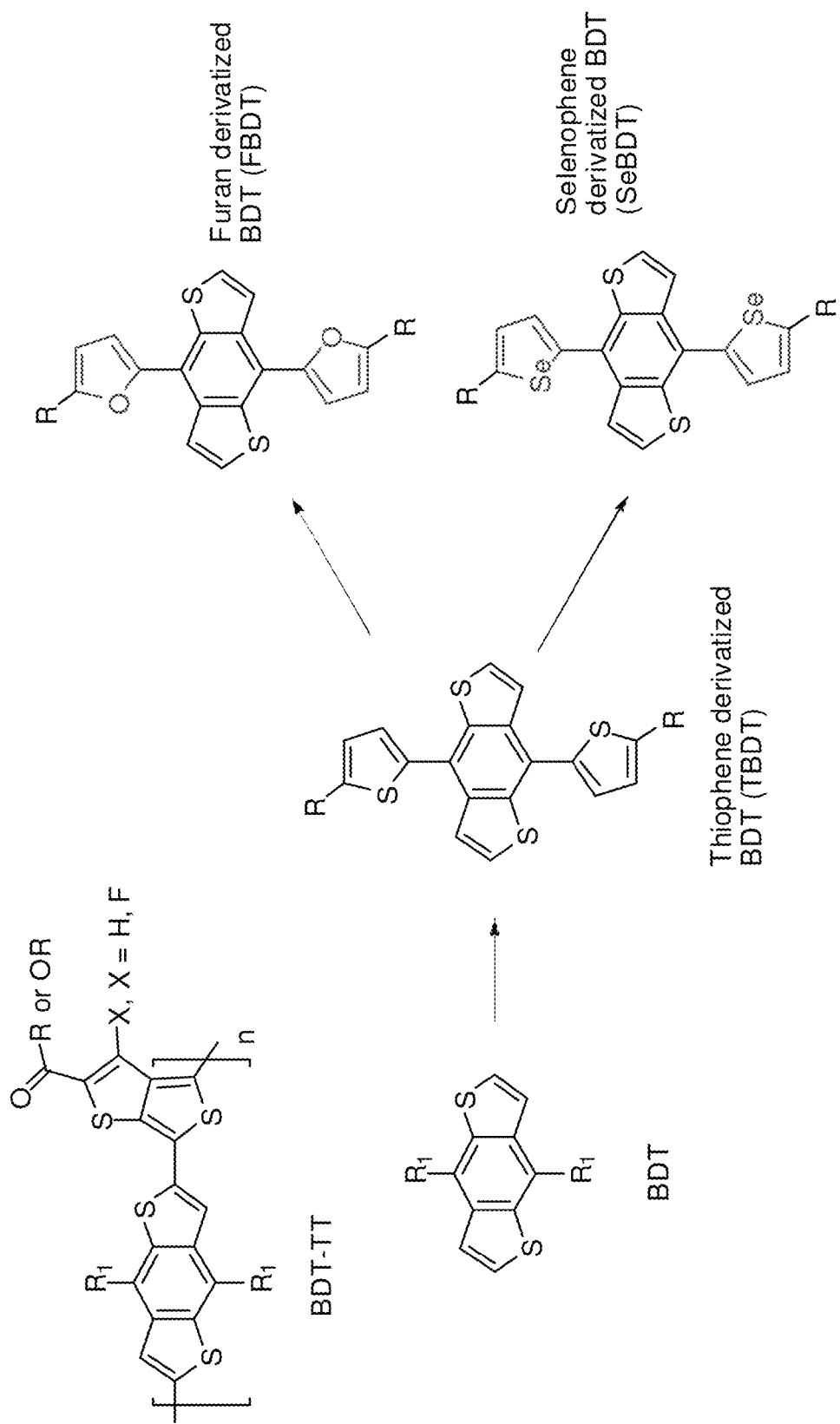
FIG. 1 illustrates the structures of a benzo[1,2-b:3,4-b']dithiophene(BDT)-thienothiophene (BDT-TT) based conjugated polymer and furan and selenophene derivatized BDT monomers in embodiments of the present invention.

Structures of a benzo[1,2-b:3,4-b']dithiophene-thienothiophene based conjugated polymer and furan and selenophene derivatized benzo[1,2-b:3,4-b']dithiophene monomers are shown in FIG. 1. As illustrated in FIG. 1, the BDT-TT based polymer has alkyl groups R and $R_1$, wherein R may be selected from the group consisting of alkyls and alkoxys, or, alternatively, C1 to C15 alkyls and C1 to C15 alkoxys or, alternatively, C4 to C10 alkyls and C4 to C10 alkoxys, and wherein $R_1$ may be selected from the group of furan, thiophene and selenophene. In an embodiment, the BDT-TT based polymer has n repeating units, wherein n may equal from about 1 to about 100, about 1 to about 50 or about 10 to about 30. In an embodiment, the BDT-TT based polymer has a halogen group X, wherein X may be selected from the group consisting of hydrogen, fluoride, chloride, bromine and iodine. In an embodiment, the BDT monomer has an alkyl group $R_1$, wherein $R_1$ may be selected from furan, thiophene and selenophene. In an embodiment, the thiophene derivatized BDT (TBDT) monomer, furan derivatized BDT (FBDT) monomer and selenophene derivatized BDT (SeBDT) monomer have an alkyl group R, wherein R may be selected from the group consisting of alkyls and alkoxys or, alternatively, C1 to C15 alkyls and C1 to C15 alkoxys, or, alternatively, C4 to C10 alkyls and C4 to C10 alkoxys.

Figure 2:
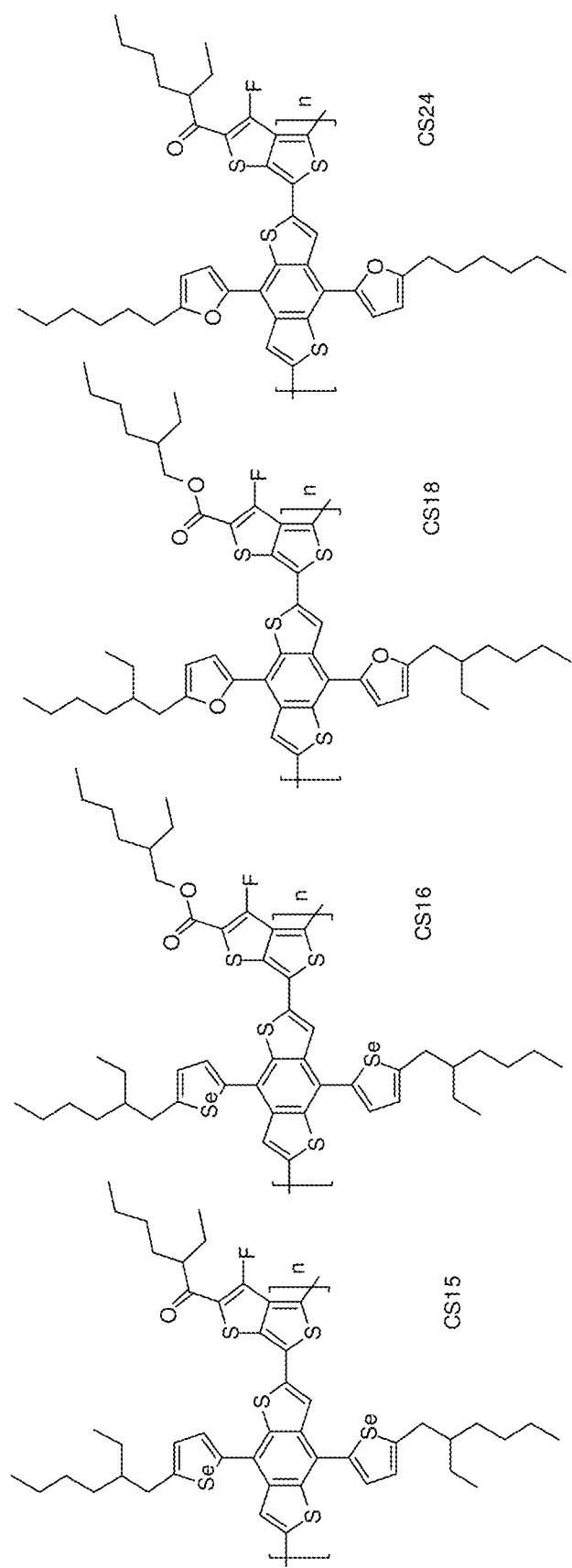
FIG. 2 illustrates the structures of furan and selenophene derivatized BDT-TT based conjugated polymers, namely, poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl (CS-15), poly[(4,8-bis(5-(2-ethyhexyl)selenophen-2-yl)-benzo[1,2-b;4,5-b']dithiophene)-2,6-diyl-alt-(4-(2-ethylhexyl)-3-fluorothieno[3,4-b]thiophene)-2-carboxylate-2-6-diyl (CS-16), poly[(4,8-bis(5-(2-ethyhexyl)furan-2-yl)-benzo[1,2-b;4,5-b']dithiophene)-2,6-diyl-alt-(4-(2-ethylhexyl)-3-fluorothieno[3,4-b]thiophene)-2-carboxylate-2-6-diyl (CS-18) and poly[(4,8-bis(5-hexylfuran-2-yl)-benzo[1,2-b;4,5-b']dithiophene)-2,6-diyl-alt-(4-(2-ethylhexanoyl)-3-fluorothieno[3,4-b]thiophene)-2-6-diyl (CS-24) in embodiments of the present invention.

Structures of furan and selenophene derivatized benzo[1,2-b:3,4-b']dithiophene-thienothiophene based conjugated polymers, namely, poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl, poly[(4,8-bis(5-(2-ethyhexyl)selenophen-2-yl)-benzo[1,2-b;4,5-b']dithiophene)-2,6-diyl-alt-(4-(2-ethylhexyl)-3-fluorothieno[3,4-b]thiophene)-2-carboxylate-2-6-diyl, poly[(4,8-bis(5-(2-ethyhexyl)furan-2-yl)-benzo[1,2-b;4,5-b']dithiophene)-2,6-diyl-alt-(4-(2-ethylhexyl)-3-fluorothieno[3,4-b]thiophene)-2-carboxylate-2-6-diyl and poly[(4,8-bis(5-hexylfuran-2-yl)-benzo[1,2-b;4,5-b']dithiophene)-2,6-diyl-alt-(4-(2-ethylhexanoyl)-3-fluorothieno[3,4-b]thiophene)-2-6-diyl are shown in FIG. 2. These furan and selenophene derivatized BDT-TT based conjugated polymers among others have been successfully synthesized as discussed below.

Figure 3:
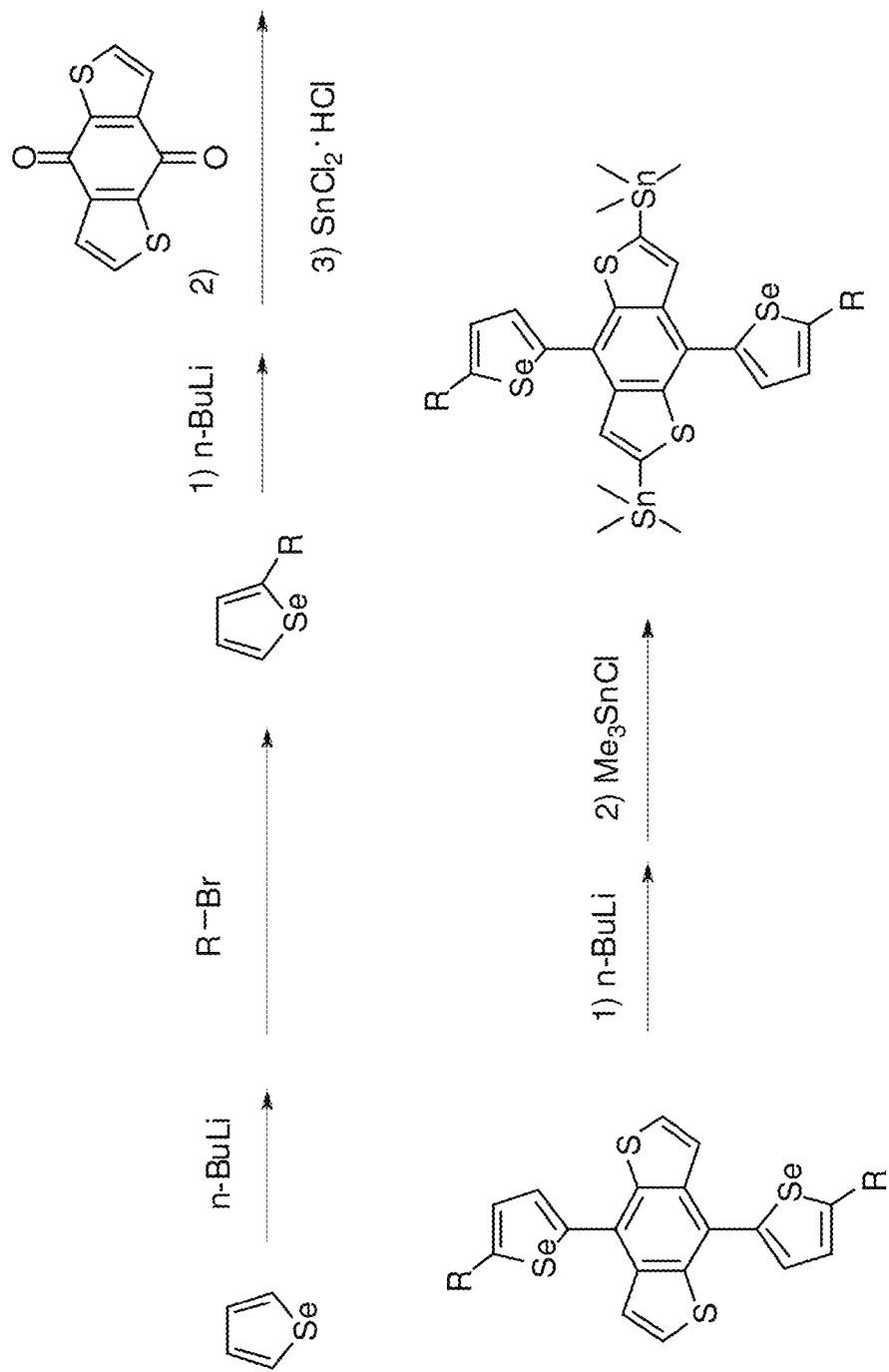
FIG. 3 illustrates the synthesis of selenophene derivatized benzo[1,2-b:3,4-b']dithiophene (BDT) monomer in an embodiment of the present invention.

A synthesis of selenophene derivatized benzo[1,2-b:3,4-b']dithiophene monomers (SeBDT) is shown in FIGS. 1 and 3. In an embodiment, the SeBDT monomer has an alkyl group R, wherein R may be selected from the group consisting of alkyls or alkoxys or, alternatively, C1 to C15 alkyls and $C_1$ to C15 alkoxys, or, alternatively, C4 to C10 alkyls and C4 to C10 alkoxys. If selenium is replaced with oxygen, a synthesis of furan derivatized BDT (FBDT) monomers is also illustrated by FIGS. 1 and 3.

Selenophene Derivative BDT-TT Based Polymer (CS-15) Example

Figure 4:
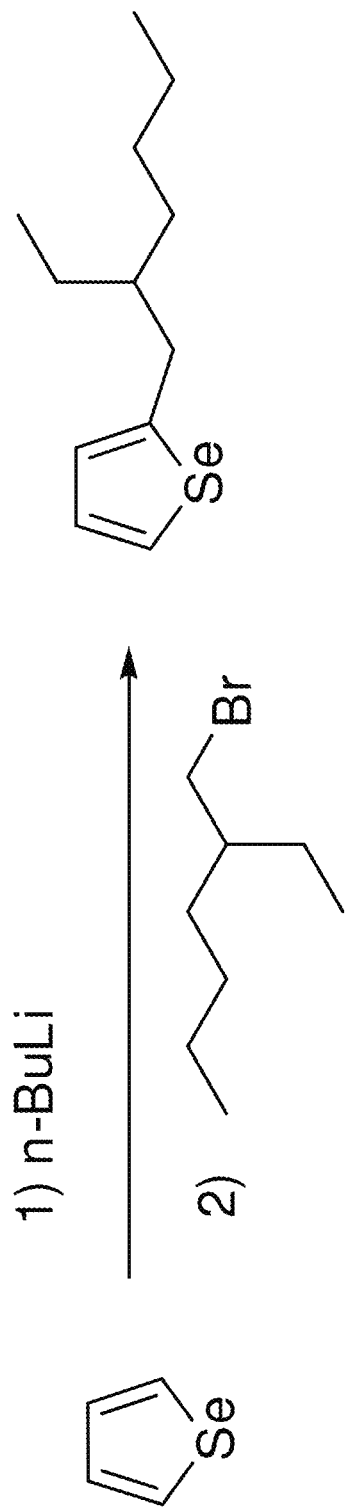
FIG. 4 illustrates the synthesis of 2-(2-ethyhexyl)selenophene monomer in an embodiment of the present invention.

A synthesis of a selenophene derivatized benzo[1,2-b:3,4-b']dithiophene-thienothiophene based conjugated polymer, namely, poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl is illustrated in FIGS. 1 through 5. In FIGS. 3 and 4, a synthesis of 2-(2-ethylhexyl)selenophene monomer is depicted. As shown in FIGS. 3 and 4, a 10.2 g selenophene (76.3 mmol) was dissolved in 150 mL of anhydrous tetrahydrofuran (THF). Then, the solution was cooled to −78° C. A 31.1 mL of 2.5 M n-butyllithium (n-BuLi) (77.8 mmol) was added dropwise to the solution. The reaction mixture was stirred at −78° C. for about ½ hour before warming the reaction mixture to room temperature for about 1 hour. The reaction mixture was re-cooled to −20° C. Then, as shown in FIG. 4, a 18.0 g 2-ethylhexylbromide (93.4 mmol) was added to the reaction mixture in two portions. After stirring overnight, the reaction mixture was poured into ice water. The organic phase was isolated and the aqueous phase was extracted with hexane. The combined organic phase was dried over anhydrous sodium sulfate ($Na_2SO_4$). After removal of the solvent by rotary evaporator, the residue was purified by elution with hexane by column chromatography to afford 10.3 g 2-(2-ethylhexyl)selenophene monomer as shown in FIG. 4. The yield was about 54.5%.

Based upon analysis by GC-MS, the 2-(2-ethylhexyl)selenophene monomer was found to contain about 5% of a 1,4-di-(2-(2-ethylhexyl)selenophene monomer. Thus, the 2-(2-ethylhexyl)selenophene monomer had an estimated purity of about 95%.

In FIG. 3, a synthesis of 4,8-bis(5-(2-ethylhexyl)selenophene-2-yl)benzo[1,2-b:4,5-b']dithiophene is depicted. As shown in FIG. 3, a 9.8 (about 9.3 g based upon estimated 95% purity) 2-(2-ethylhexyl)selenophene monomer (about 38.3 mmol based upon estimated 95% purity) was dissolved in 150 mL of anhydrous tetrahydrofuran (THF). Then, the solution was cooled to −78° C. A 15.32 mL of 2.5 M n-butyllithium (n-BuLi) (38.3 mmol) was added dropwise to the solution. The reaction mixture was stirred at −78° C. for about ½ hour before warming the reaction mixture to room temperature for about 1 hour. A 2.11 g benzo[1,2-b:4,5-b']dithiophene-4,8-dione was added in a single portion. Then, the resulting reaction mixture was warmed to 50° C. for about 5 hours. A 16.87 g Tin(II) chloride dihydrate ($SnCl_2.2H_2O$) (76.6 mmol) in 18% aqueous hydrochloric acid (HCl) was added to the reaction mixture. The reaction mixture was stirred overnight at about 40~50° C. The organic phase was isolated and the water phase was extracted with hexane. The combined organic phase was dried over anhydrous sodium sulfate ($Na_2SO_4$). After removal of the solvent by rotary evaporator, the residue was purified by elution with hexane by column chromatography to afford 5.2 g 4,8-bis(5-(2-ethylhexyl)selenophene-2-yl)benzo[1,2-b:4,5-b']dithiophene (FIG. 3) as a yellow oil. The yield was about 80.7%.

Figure 5:
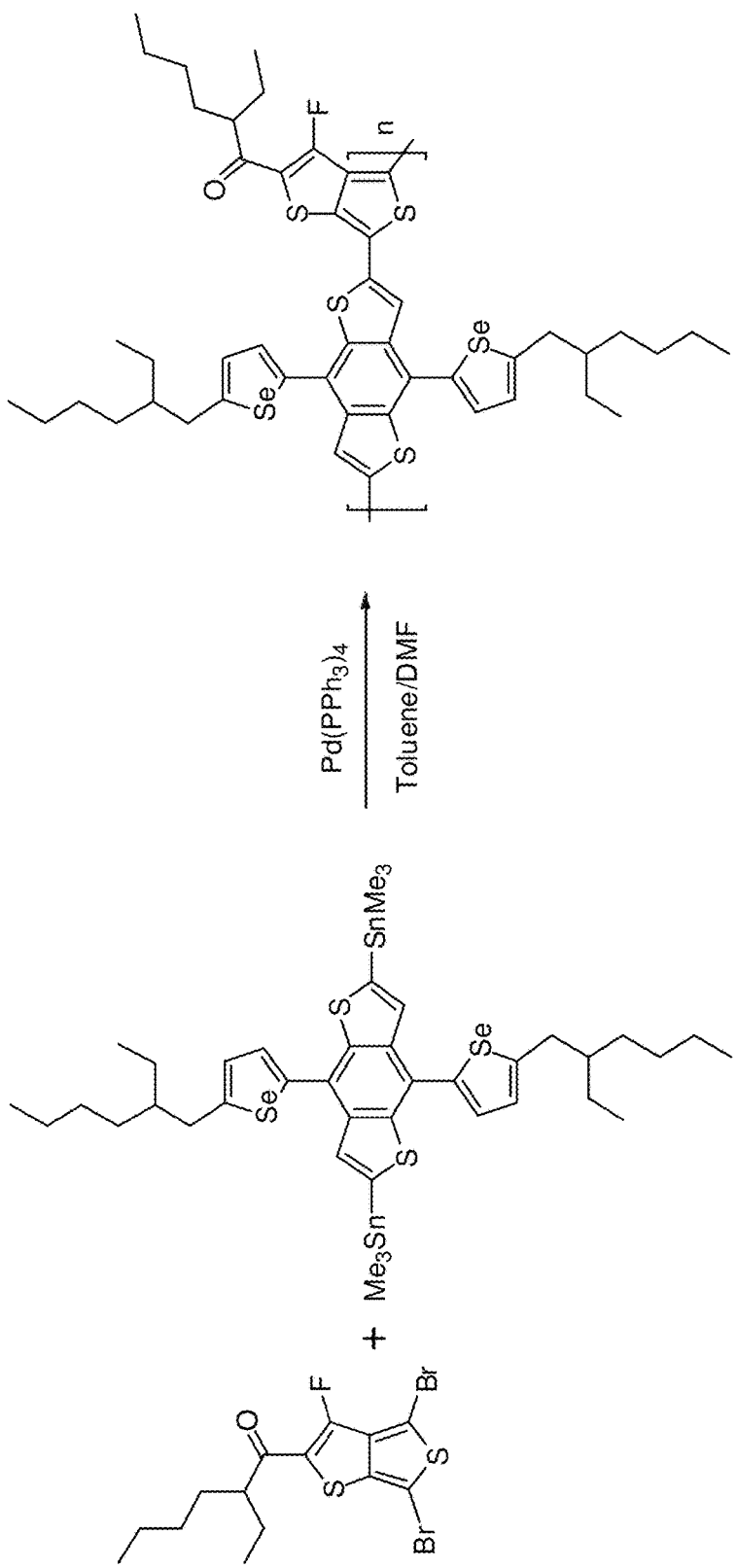
FIG. 5 illustrates the synthesis of a selenophene derivatized BDT-TT based conjugated polymer, namely, poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl (CS-15) in an embodiment of the present invention.

In FIGS. 3 and 5, a synthesis of (4,8-bis(5-(2-ethylhexyl)selenophen-2-yl)-benzo[1,2-b:4,5-b']dithiophene-2,6-diyl) bis(trimethylstannane) is depicted. As shown in FIG. 3, a 2.5 g 4,8-bis(5-(2-ethylhexyl)selenophen-2-yl)benzo[1,2-b:4,5-b']dithiophene monomer (3.7 mmol) was dissolved in 50 mL of anhydrous tetrahydrofuran (THF). Then, the solution was cooled to −78° C. A 3.7 mL of 2.5 M n-butyllithium (n-BuLi) (9.25 mmol) was added dropwise to the solution. The reaction mixture was stirred at −78° C. for about ½ hour before warming the reaction mixture to room temperature for about 1 hour. Then, the reaction mixture was re-cooled to −78° C. A 11 mL of 1.0 M trimethylstannane (Me$_3$SnCl) (11 mmol) in tetrahydrofuran (THF) solution was added dropwise to the reaction mixture. Then, the reaction mixture was warmed to room temperature for about 3 hours. The reaction mixture was quenched with 100 mL of water and extracted with hexane. The combined organic phase was dried over anhydrous sodium sulfate (Na$_2$SO$_4$). After solvent removal by rotary evaporator, the residue was re-crystallized in isopropanol to afford 2.0 g (4,8-bis(5-(2-ethylhexyl)selenophen-2-yl)-benzo[1,2-b:4,5-b']dithiophene-2,6-diyl)bis(trimethylstannane) as shown in FIG. 5. The yield was about 53.9%.

In FIG. 5, a synthesis of a selenophene derivatized benzo[1,2-b:3,4-b']dithiophene-thienothiophene based conjugated polymer, namely, poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl is depicted. As shown in FIG. 5, a 0.120 g 1-(4,6-dibromo-3-fluorothieno[3,4-b]thiophen-2-yl)-2-ethylhexan-1-one and a 0.271 g (4,8-bis(5-(2-ethylhexyl)thiophen-2-yl)-benzo[1,2-b:4,5-b']dithiophene-2,6-diyl)bis (trimethylstannane) was dissolved in 5.5 mL toluene with 1.1 mL dimethyformamide (DMF). The reaction mixture was purged with argon for about 10 minutes. Then, a 12.6 mg palladium-tetrakis(triphenylphosphine) (Pd(PPh$_3$)$_4$) catalyst was added to the reaction mixture. After being purged with argon for an additional 20 minutes, the reaction mixture was refluxed for about 8 hours under an argon atmosphere. Ideally, the reaction mixture should be refluxed for about 16 hours under an argon atmosphere. Then, the reaction mixture was cooled to room temperature. The polymer was precipitated by addition of 100 mL methanol. The polymer precipitate was re-dissolved in chloroform and the polymer was re-precipitated by addition of hexane. The polymer residue was dried over vacuum to afford a 0.193 g of CS-15 polymer (FIGS. 2 and 5) as a dark blue solid. The yield was about 74.5%.

Figure 6:
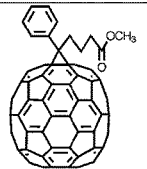
FIG. 6 illustrates the structures of acceptors, namely, $PC_{70}BM$, $BisIndene-C_{70}$, $BisPC_{70}BM$, $BisBenzene-C_{70}$, $TrisPC_{70}BM$ and $PC_{76}BM$ in embodiments of the present invention.
Figure 6:
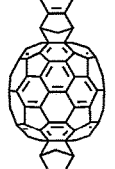
Figure 6:
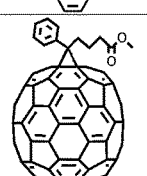
Figure 6:
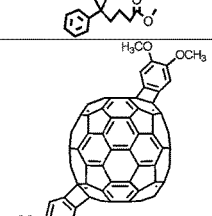
Figure 6:
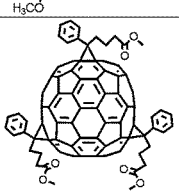
Figure 6:
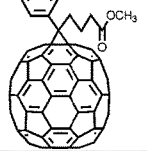
Figure 7:
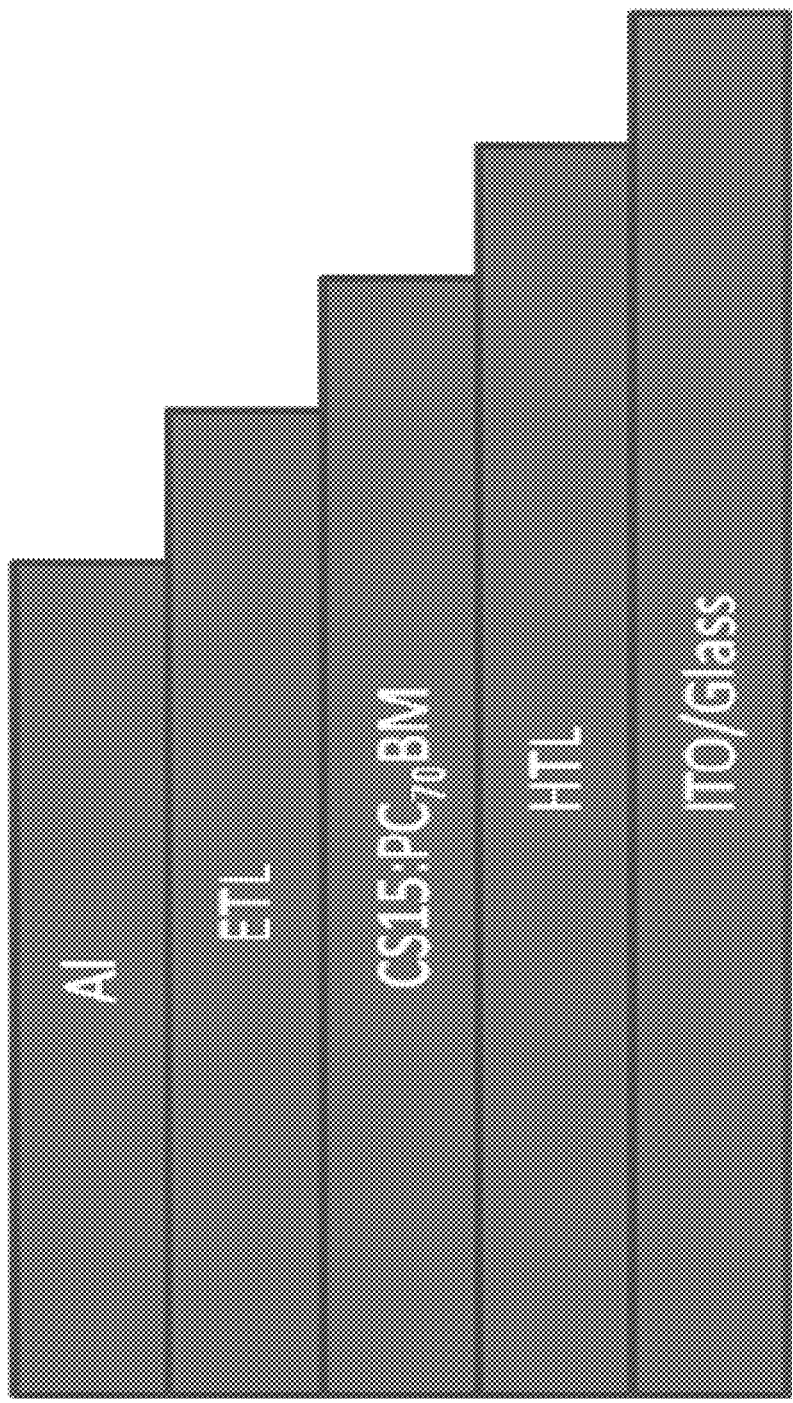
FIG. 7 illustrates a structure of an organic solar cell using poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl (CS-15) polymer composition of FIG. 5 as a donor and a $PC_{70}BM$ of FIG. 6 as an acceptor in the bulk heterojunction layer.

An organic solar cell structure is illustrated in FIG. 7, wherein Al is an aluminum layer (anode), ETL is an electron transport layer (acceptor), HTL is a hole transport layer (donor) and ITO/glass is an indium tin oxide glass layer (cathode). In an embodiment, Al may be substituted with Ag, wherein Ag is a silver layer (anode). In an embodiment, the bulk heterojunction (BHJ) material is constructed from a donor and an acceptor. Suitable donors include furan, thiophene and/or selenophene derivatized benzo[1,2-b:3,4-b']dithiophene-thienothiophene based conjugated polymers. Suitable acceptors include PC$_{70}$BM, BisIndene-C$_{70}$, BisPC$_{70}$BM, BisBenzene-C$_{70}$, TrisPC$_{70}$BM and PC$_{76}$BM. The structures for these acceptors are illustrated in FIG. 6.

In an example, the BHJ layer was constructed from a donor, namely, selenophene derivatized BDT-TT based conjugated polymer and an acceptor, namely, poly[(4,8-bis(5-(2-ethyhexyl)selenophen-2-yl)-benzo[1,2-b;4,5-b']dithiophene)-2,6-diyl-alt-(4-(2-ethylhexanoyl)-3-fluorothieno[3,4-b]thiophene)-2-6-diyl: [6,6]-phenyl C$_{70}$-butyric acid methyl ester (CS-15:PC$_{70}$BM) as illustrated in FIGS. 5 and 6. If the selenium atom is replaced with oxygen in the CS-15, a bulk heterojunction (BHJ) layer constructed from a donor, namely, furan derivatized BDT-TT and an acceptor, namely, poly[(4,8-bis(5-(2-ethylhexyl)furan-2-yl)-benzo[1,2-b;4,5-b']dithiophene)-2,6-diyl-alt-(4-(2-ethylhexyl)-3-fluorothieno[3,4-b]thiophene)-2-carboxylate-2-6-diyl (CS-18:PC$_{70}$BM) is also illustrated by FIGS. 5 and 6.

Figure 8:
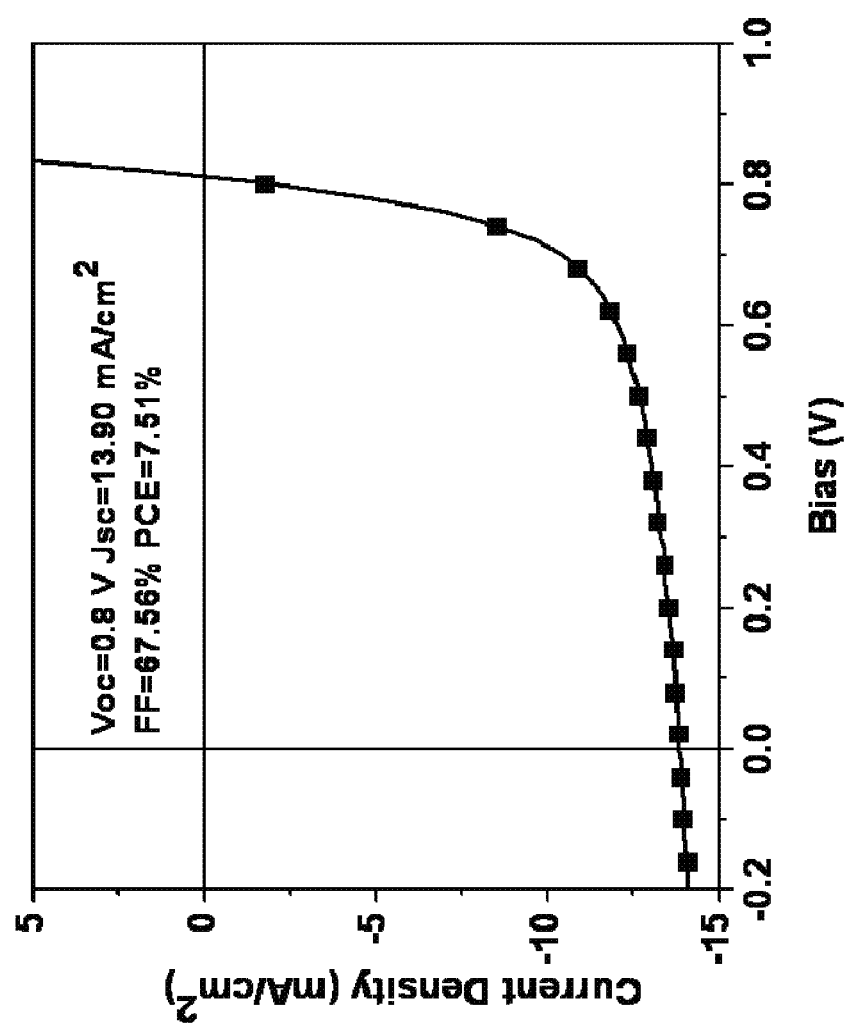
FIG. 8 illustrates a chart of Bias (V) versus current density (mA/cm2) for the organic solar cell of FIG. 7.

In an example, an organic solar cell constructed from CS-15:PC$_{70}$BM (FIGS. 5 and 6) exhibited a power conversion efficiency (PCE) as high as 7.5%. See FIG. 8. As shown in FIG. 8, a bias voltage from about −0.2 to about 0.8 V was applied to the solar cell. The solar cell produced a current density from about −13.9 to about −1.5 mA/cm$^2$. The open circuit voltage (Voc) was 0.8 V, short circuit current density (Jsc) was 13.90 mA/cm$^2$, fill factor (FF) was 67.56% and power conversion efficiency was 7.51%. The fill factor (FF) is defined as the ratio of the maximum obtainable power to the product of the open circuit voltage (Voc) and short circuit current (Jsc):

$$FF = \text{maximum obtainable power}/(Voc*Jsc).$$

Selenophene Derivative BDT-TT Based Polymer (CS-16) Example

In FIG. 2, a selenophene derivatized benzo[1,2-b:3,4-b']dithiophene-thienothiophene based conjugated polymer, namely, poly[(4,8-bis(5-(2-ethyhexyl)selenophen-2-yl)-benzo[1,2-b;4,5-b']dithiophene)-2,6-diyl-alt-(4-(2-ethylhexyl)-3-fluorothieno[3,4-b]thiophene)-2-carboxylate-2-6-diyl is depicted. A 0.1275 g 2-ethylhexyl-4,6-dibromo-3-fluorotheino[3,4-b]thiophene-2-carboxylate and a 0.2697 g (4,8-bis(5-(2-ethylhexyl)thiophen-2-yl)-benzo[1,2-b:4,5-b']dithiophene-2,6-diyl)bis(trimethylstannane) were dissolved in 5.5 mL toluene with 1.1 mL dimethyformamide (DMF). The reaction mixture was purged with argon for about 10 minutes. Then, a 12.5 mg palladium-tetrakis(triphenylphosphine) (Pd(PPh$_3$)$_4$) catalyst was added to the reaction mixture. After being purged with argon for an additional 20 minutes, the reaction mixture was refluxed for about 16 hours under an argon atmosphere. Then, the reaction mixture was cooled to room temperature. The polymer was precipitated by addition of 100 mL methanol. The polymer precipitate was re-dissolved in chloroform and the polymer was re-precipitated by addition of hexane. The polymer residue was dried over vacuum to afford a 0.163 g of CS-16 polymer as shown in FIG. 2. The yield was about 61.5%.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

DEFINITIONS

As used herein, the terms "a," "an," "the," and "said" means one or more.

As used herein, the term "about" means the stated value plus or minus a margin of error or plus or minus 10% if no method of measurement is indicated.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, the terms "comprising," "comprises," and "comprise" are open-ended transition terms used to transition from a subject recited before the term to one or more elements recited after the term, where the element or elements listed after the transition term are not necessarily the only elements that make up the subject.

As used herein, the terms "containing," "contains," and "contain" have the same open-ended meaning as "comprising," "comprises," and "comprise," provided above.

As used herein, the terms "having," "has," and "have" have the same open-ended meaning as "comprising," "comprises," and "comprise," provided above.

As used herein, the terms "including," "includes," and "include" have the same open-ended meaning as "comprising," "comprises," and "comprise," provided above.

As used herein, the phrase "consisting of" is a closed transition term used to transition from a subject recited before the term to one or more material elements recited after the term, where the material element or elements listed after the transition term are the only material elements that make up the subject.

As used herein, the phrase "consisting essentially of" occupies a middle ground, allowing the addition of non-material elements that do not substantially change the nature of the invention, such as various buffers, differing salts, extra wash or precipitation steps, pH modifiers, and the like.

As used herein, the term "simultaneously" means occurring at the same time or about the same time, including concurrently.

INCORPORATION BY REFERENCE

All patents and patent applications, articles, reports, and other documents cited herein are fully incorporated by reference to the extent they are not inconsistent with this invention.

What is claimed is:
1. A derivatized benzo[1,2-b:3,4-b']dithiophene-thienothiophene based polymer having the formula

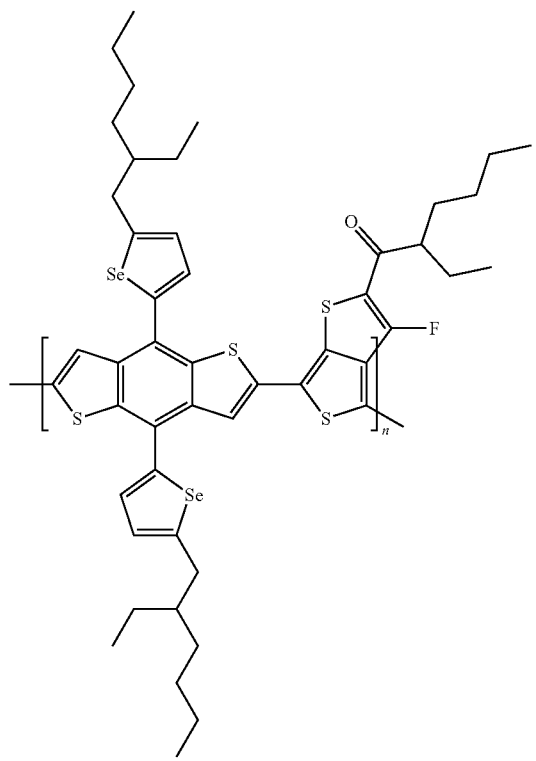

wherein n is equal to about 1 to about 100.

2. The derivatized benzo[1,2-b:3,4-b']dithiophene-thienothiophene based polymer of claim 1, wherein n is equal to about 10 to about 30.

3. The derivatized benzo[1,2-b:3,4-b']dithiophene-thienothiophene based polymer of claim 1, wherein n is equal to about 1 to about 50.

4. A bulk heterojunction material, comprising:
    a) a derivatized benzo[1,2-b:3,4-b']dithiophene-thienothiophene based polymer as in claim 1 as a donor; and
    b) an acceptor.

5. The bulk heterojunction material of claim 4, wherein the acceptor is selected from the group consisting of PC70BM, BisIndene-C70, BisPC70BM, BisBenzene-C70, TrisPC70BM and PC76BM.

6. An organic solar cell device comprising:
    a) a silver layer;
    b) a bulk heterojunction layer, wherein the bulk heterojunction layer comprises:
        i. at least one derivatized benzo[1,2-b:3,4-b']dithiophene-thienothiophene based polymer as in claim 1 as a donor; and
        ii. an acceptor; and
    c) an indium tin oxide glass layer.

7. The organic solar cell device of claim 6, wherein the acceptor is selected from the group consisting of $PC_{70}BM$, BisIndene-$C_{70}$, BisPC$_{70}$BM, BisBenzene-$C_{70}$, TrisPC$_{70}$BM and PC$_{76}$BM.

8. The bulk heterojunction material of claim 4, wherein, in the derivatized benzo[1,2-b:3,4-b']dithiophene-thienothiophene based polymer of claim 1, n is equal to about 10 to about 30.

9. The bulk heterojunction material of claim 4, wherein, in the derivatized benzo[1,2-b:3,4-b']dithiophene-thienothiophene based polymer of claim 1, n is equal to about 1 to about 50.

10. The organic solar cell device of claim 6, wherein, in the derivatized benzo[1,2-b:3,4-b]dithiophene-thienothiophene based polymer of claim 1, n is equal to about 10 to about 30.

11. The organic solar cell device of claim 6, wherein, in the derivatized benzo[1,2-b:3,4-b']dithiophene-thienothiophene based polymer of claim 6, n is equal to about 1 to about 50.

\* \* \* \* \*